United States Patent
Lim (10) Patent No.: US 10,424,573 B1
(45) Date of Patent: Sep. 24, 2019

(54) PACKAGING PROCESS

(71) Applicant: Delta Electronics Int'l (Singapore) Pte Ltd, Singapore (SG)

(72) Inventor: Beng Beng Lim, Singapore (SG)

(73) Assignee: DELTA ELECTRONICS INT'L (SINGAPORE) PTE LTD, Singapore (SG)

( * ) Notice: Subject to any disclaimer, the term of this patent is extended or adjusted under 35 U.S.C. 154(b) by 36 days.

(21) Appl. No.: 15/955,085

(22) Filed: Apr. 17, 2018

(30) Foreign Application Priority Data

Mar. 27, 2018 (SG) .............. 10201802515P (51) Int. Cl.
| | |
|---|---|
| H01L 25/00 | (2006.01) |
| H01L 23/00 | (2006.01) |
| H01L 23/367 | (2006.01) |
| H01L 25/16 | (2006.01) |
| H01L 21/683 | (2006.01) |

(52) U.S. Cl.
CPC .......... *H01L 25/50* (2013.01); *H01L 21/6835* (2013.01); *H01L 23/367* (2013.01); *H01L 24/03* (2013.01); *H01L 24/08* (2013.01); *H01L 24/19* (2013.01); *H01L 24/24* (2013.01); *H01L 25/16* (2013.01); *H01L 2221/6834* (2013.01); *H01L 2221/68318* (2013.01); *H01L 2221/68327* (2013.01); *H01L 2224/0231* (2013.01); *H01L 2224/0239* (2013.01); *H01L 2224/02379* (2013.01); *H01L 2224/0311* (2013.01); *H01L 2224/0345* (2013.01); *H01L 2224/0391* (2013.01); *H01L 2224/03602* (2013.01); *H01L 2224/05073* (2013.01); *H01L 2224/05147* (2013.01); *H01L 2224/05573* (2013.01); *H01L 2224/05647* (2013.01); *H01L 2224/08225* (2013.01); *H01L 2224/08265* (2013.01);
(Continued)

(58) Field of Classification Search
CPC ..... H01L 25/0657; H01L 21/56; H01L 21/52; H01L 25/50; H01L 24/17; H01L 24/81; H01L 24/11; H01L 2924/181; H01L 21/568; H01L 21/6835; H01L 21/304; H01L 2221/6834; H01L 23/3114; H01L 2224/83005; H01L 2224/81005
See application file for complete search history.

(56) References Cited

U.S. PATENT DOCUMENTS

| | | | |
|---|---|---|---|
| 6,974,724 B2 | 12/2005 | Hyvonen et al. | |
| 7,294,529 B2 | 11/2007 | Tuominen | |

(Continued)

FOREIGN PATENT DOCUMENTS

KR 101681028 B1 12/2016

*Primary Examiner* — Roy Potter
(74) *Attorney, Agent, or Firm* — Kirton McConkie; Evan R. Witt (57) ABSTRACT

A packaging process of an electronic component is provided. By the packaging process of the disclosure, the electronic component is grinded by the back grinding process. Consequently, thickness of the electronic component may be reduced to less than or equal to 50 μm. The packaging process may achieve ultra-thin thickness and reduce the space of the power module. Moreover, the packaging process forms the contact pads with drilling process and grinding process without photolithography process. Consequently, the packaging process is advantageous because of lower cost and uniform thickness of the contact pads.

13 Claims, 10 Drawing Sheets (52) U.S. Cl.
CPC ............... *H01L 2224/24137* (2013.01); *H01L 2224/24265* (2013.01); *H01L 2924/19102* (2013.01)

(56) References Cited

U.S. PATENT DOCUMENTS

| | | |
|---|---|---|
| 9,153,476 B2 | 10/2015 | Chi |
| 9,177,926 B2 | 11/2015 | Scanlan et al. |
| 9,269,699 B2 | 2/2016 | Niu et al. |
| 9,425,131 B2 | 8/2016 | Chen |
| 9,559,039 B2 | 1/2017 | Shim et al. |
| 9,564,346 B2 | 2/2017 | Su et al. |
| 9,716,068 B2 | 7/2017 | Meyer |
| 2010/0264566 A1* | 10/2010 | Moore ................ H01L 21/6835 264/401 |
| 2013/0105991 A1* | 5/2013 | Gan ...................... H01L 25/105 257/777 |
| 2015/0187710 A1* | 7/2015 | Scanlan ................ H01L 24/05 257/777 |
| 2016/0293524 A1 | 10/2016 | Grassmann et al. |

* cited by examiner

PACKAGING PROCESS

FIELD OF THE INVENTION

The present invention relates to a packaging process, and more particularly to a packaging process of an electronic component.

BACKGROUND OF THE INVENTION

Recently, the general trends in designing electronic devices are toward small size, light weightiness and easy portability. Moreover, with the increasing development of electronic industries, the internal circuitries of the electronic devices are gradually modularized. In other words, plural electronic components are integrated into a single electronic module. For example, a power module is one of the widely-used electronic modules. An example of the power module includes but is not limited to a DC-to-DC converter, a DC-to-AC converter or an AC-to-DC converter. After the electronic components (e.g. integrated circuit (IC) chips, capacitors, resistors, inductors, transformers, diodes and transistors) are integrated as a power module, the power module may be installed on a motherboard or a system circuit board.

Nowadays, an embedded package structure is widely adopted because of many advantages such as smaller footprint, lower profile, higher power density and performance, better thermal management, lower electrical noise and mass production.

However, the conventional embedded package still has some drawbacks. For example, thickness of the conventional embedded package is generally more than 350 μm without a passive component. Consequently, it is difficult to reduce the space of the power module. Moreover, a re-distribution layer (RDL) is an extra metal layer formed on the electronic components of the embedded package structure that makes the conducting terminals of the electronic component available in other locations. The conventional embedded package forms the re-distribution layer (RDL) by photolithography process, so that the process of the conventional embedded package may increases cost. In addition, the electrolytic copper plating process easily causes non-uniform thickness of the re-distribution layer of the conventional embedded package.

Therefore, there is a need of providing an improved packaging process in order to eliminate the above drawbacks.

SUMMARY OF THE INVENTION

An object of an embodiment of the present invention provides a packaging process, in which the electronic component is grinded by the back grinding process to achieve ultra-thin thickness and reduce the space of the power module. In addition, photolithography process may be omitted in the packaging process to reduce the cost and prevent the non-uniform thickness of the re-distribution layer.

An aspect of an embodiment of the present invention provides a packaging process. Firstly, a first carrier is provided. A first thermal release material is formed on the first carrier. At least one electronic component and at least one thermal conduction structure are attached on the first thermal release material. The electronic component includes at least one conducting terminal. Then, a first insulation layer is formed on a first surface of the electronic component and a first surface of the thermal conduction structure. The first carrier and the first thermal release material are removed. Then, a second carrier is provided. A second thermal release material is formed on the second carrier. The first insulation layer with the electronic component and the thermal conduction structure is attached on the second thermal release material. Then, at least one of a portion of a second surface of the electronic component, a portion of a second surface of the thermal conduction structure, and a portion of the first insulation layer is grinded. Then, a second insulation layer is formed on the second surface of the electronic component and the second surface of the thermal conduction structure. The second carrier and the second thermal release material are removed. Then, plural first openings are formed on the first insulation layer. Then, plural second openings are formed through the corresponding first openings. The conducting terminal and the first surface of the thermal conduction structure are exposed through the plural second openings. Then, a first metal layer is formed through the plural second openings and disposed on the conducting terminal and the first surface of the thermal conduction structure. Then, plural third openings are formed on the second insulation layer. Then, plural fourth openings are formed through the plural third openings. The second surface of the thermal conduction structure is exposed through the fourth opening. Then, a second metal layer is formed through the plural fourth openings and disposed on the second surface of the thermal conduction structure. Then, a portion of the first metal layer is grinded to form at least one first contact pad and at least one second contact pad. A portion of the second metal layer is grinded to form at least one third contact pad.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When an element is referred to as being "connected," or "coupled," to another element, it can be directly connected or coupled to the other element or intervening elements may be present. Although the wide numerical ranges and parameters of the present disclosure are approximations, numerical values are set forth in the specific examples as precisely as possible. In addition, although the "first," "second," "third," and the like terms in the claims be used to describe the various elements can be appreciated, these elements should not be limited by these terms, and these elements are described in the respective embodiments are used to express the different reference numerals, these terms are only used to distinguish one element from another element. For example, a first element could be termed a second element, and, similarly, a second element could be termed a first element, without departing from the scope of example embodiments. Besides, "and/or" and the like may be used herein for including any or all combinations of one or more of the associated listed items. While the numerical ranges and parameters set forth for the broad scope of the present invention are approximations, the numerical value reported in the specific examples set forth as accurately as possible. However, any numerical values inherently contain certain errors necessarily the standard deviation found in the respective testing measurements caused. Also, as used herein, the term "about" generally means away from a given value or a range of 10%, 5%, 1% or 0.5%. Alternatively, the word "about" means within an acceptable standard error of ordinary skill in the art-recognized average. In addition to the operation/working examples, or unless otherwise specifically stated otherwise, in all cases, all of the numerical ranges, amounts, values and percentages, such as the number for the herein disclosed materials, time duration, temperature, operating conditions, the ratio of the amount, and the like, should be understood as the word "about" decorator. Accordingly, unless otherwise indicated, the numerical parameters of the present invention and scope of the appended patent proposed is to follow changes in the desired approximations. At least, the number of significant digits for each numerical parameter should at least be reported and explained by conventional rounding technique is applied. Herein, it can be expressed as a range between from one endpoint to the other or both endpoints. Unless otherwise specified, all ranges disclosed herein are inclusive.

Figure 1A:
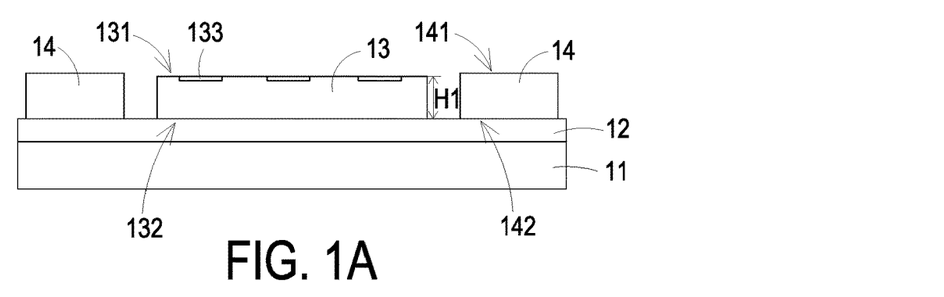
FIGS. 1A to 1Q are schematic cross-sectional views illustrating a packaging process of an electronic component according to a first embodiment of the present invention.
Figure 1B:
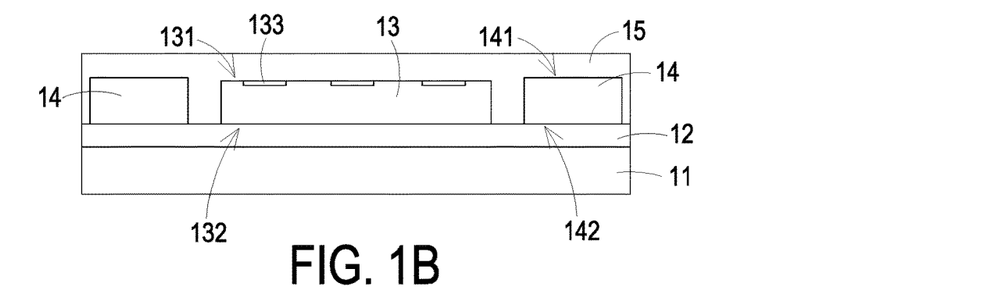
Figure 1C:
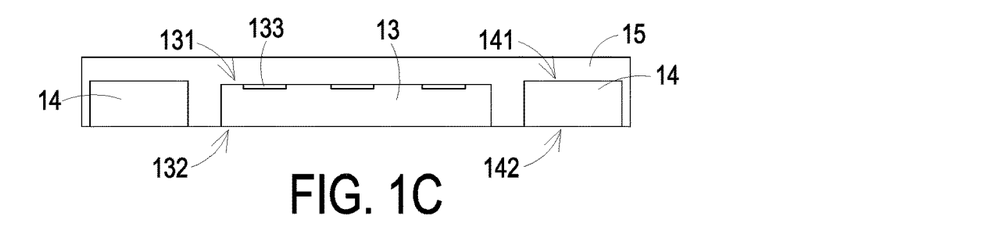
Figure 1D:
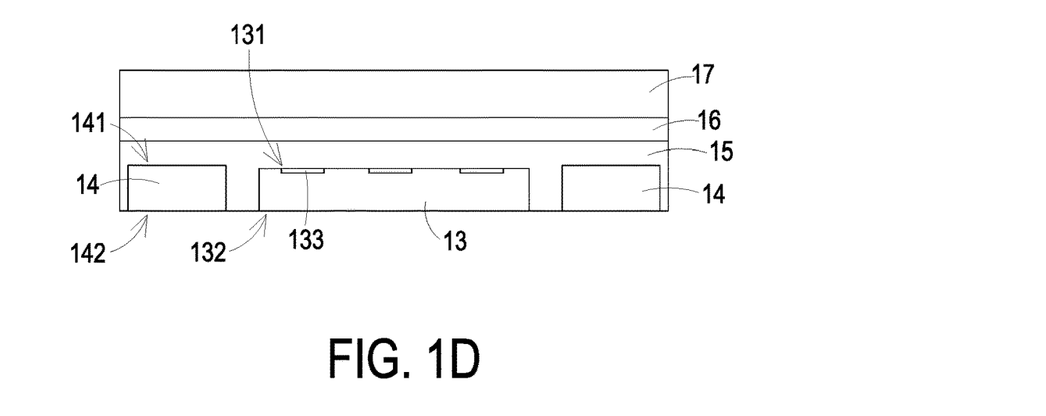
Figure 1E:
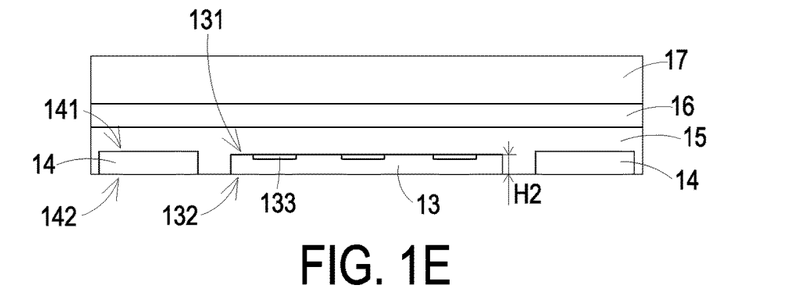
Figure 1F:
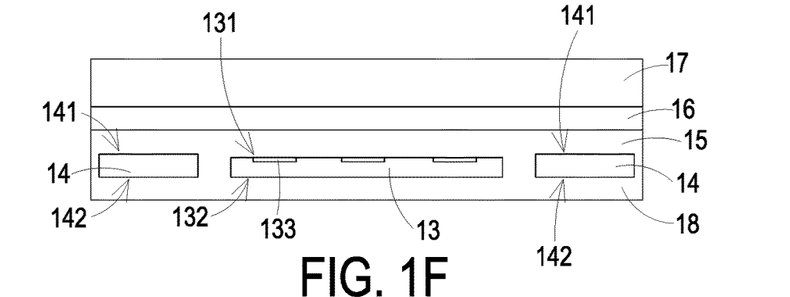
Figure 1G:
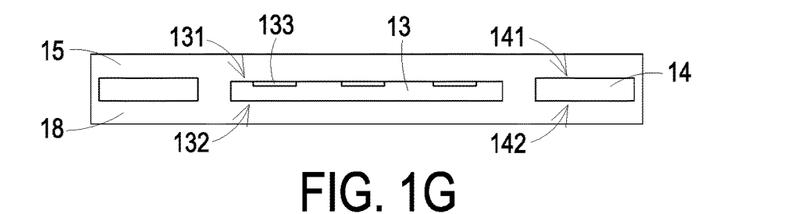
Figure 1H:
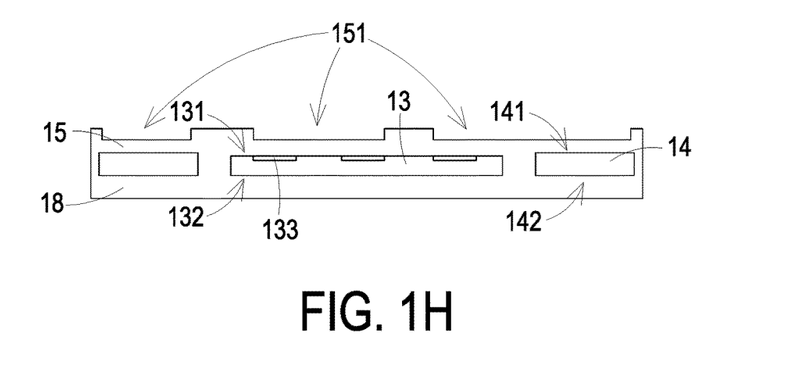
Figure 1I:
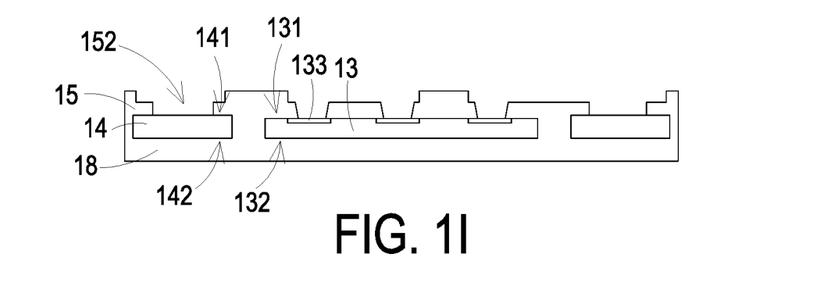
Figure 1J:
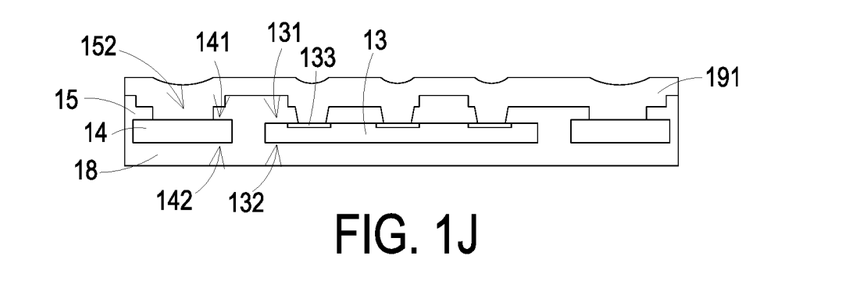
Figure 1K:
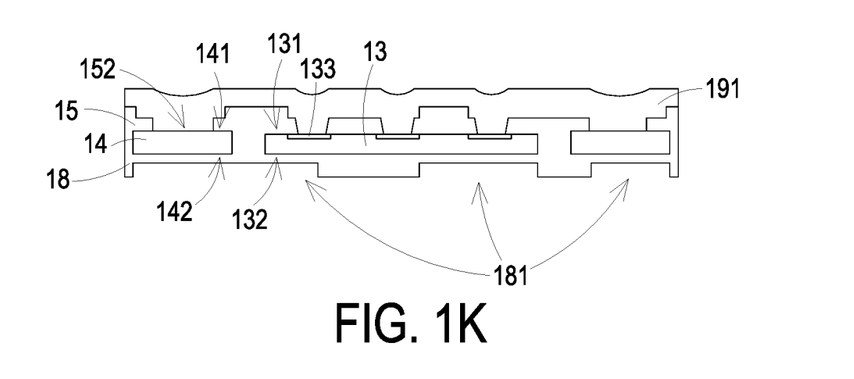
Figure 1L:
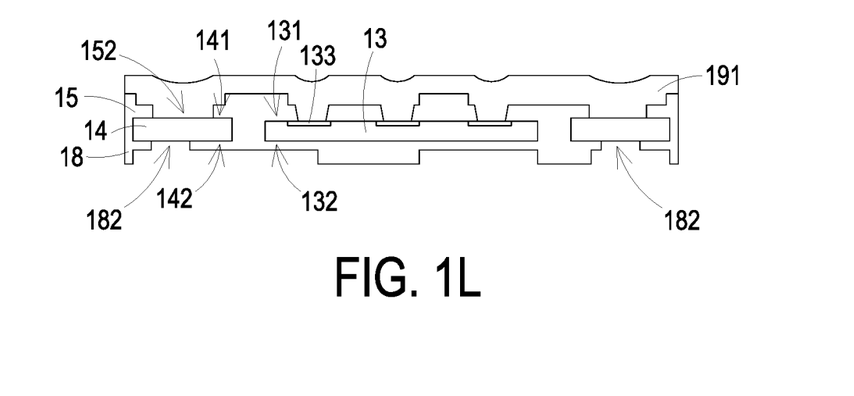
Figure 1M:
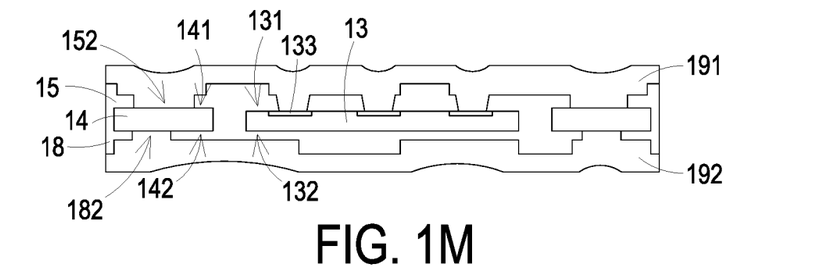
Figure 1N:
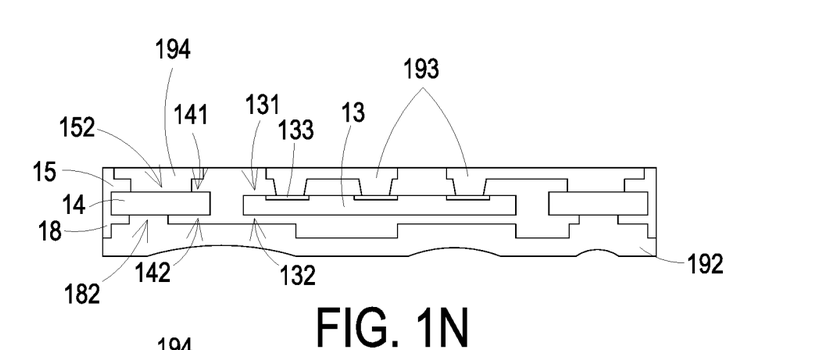
Figure 1O:
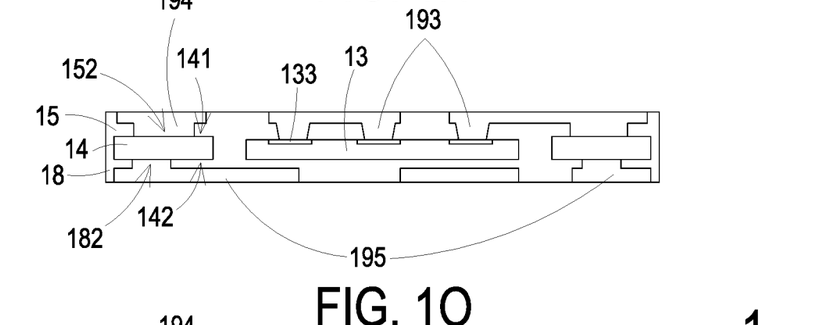
Figure 1P:
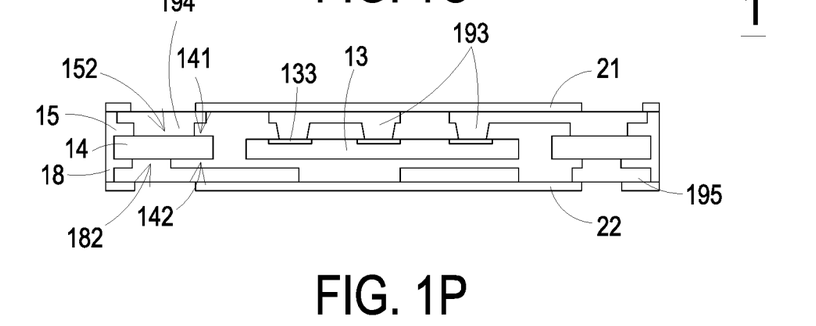
Figure 1Q:
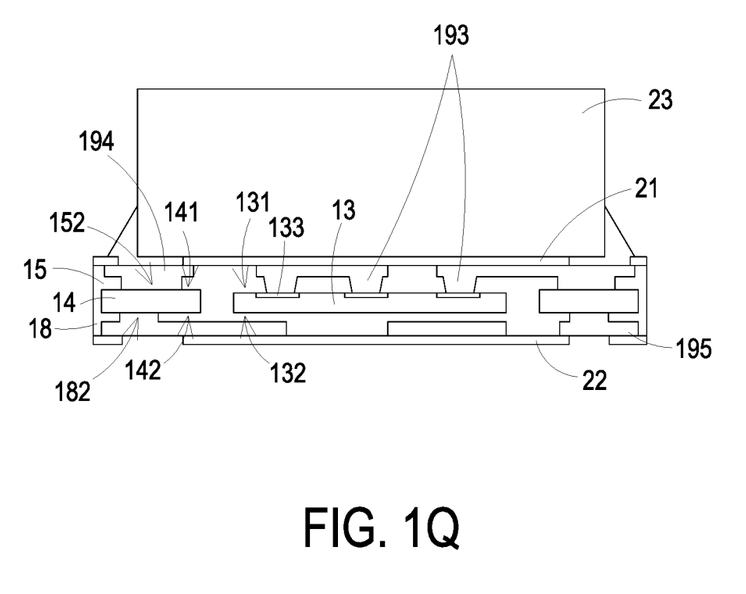

FIGS. 1A to 1Q are schematic cross-sectional views illustrating a packaging process of an electronic component according to a first embodiment of the present invention.

Firstly, as shown in FIG. 1A, a die bond process is performed. A first carrier 11 is provided. A first thermal release material 12 is formed and attached on the first carrier 11. At least one electronic component 13 and at least one thermal conduction structure 14 are provided and attached on the first thermal release material 12. In the embodiment preferably but not exclusively, thickness H1 of the electronic component 13 may be more than or equal to 125 μm. The electronic component 13 has a first surface 131 and a second surface 132. The first surface 131 of the electronic component 13 is opposite to the second surface 132 of the electronic component 13. The thermal conduction structure 14 has a first surface 141 and a second surface 142. The first surface 141 of the thermal conduction structure 14 is opposite to the second surface 142 of the thermal conduction structure 14. The second surface 132 of the electronic component 13 and the second surface 142 of the thermal conduction structure 14 are in contact with the first thermal release material 12. Moreover, the electronic component 13 includes at least one conducting terminal 133. The conducting terminal 133 is disposed on the first surface 131 of the electronic component 13. In an embodiment, the conducting terminal 133 is made of copper, aluminum, silver, gold, or any other appropriate metallic material.

In some embodiments, plural thermal conduction structures 14 are provided. The electronic component 13 is disposed between or encompassed by the plural thermal conduction structures 14.

In some embodiments, plural electronic components 13 are provided. The plural electronic components 13 are disposed between the plural thermal conduction structures 14.

The electronic component 13 may be an active component or a passive component. An example of the electronic component 13 includes but not limited to an integrated circuit (IC) chip, an integrated power component, a metal-oxide-semiconductor field-effect transistor (MOSFET), a high electron mobility transistor (HEMT), an insulated-gate bipolar transistor (IGBT), a diode, a capacitor, a resistor, an inductor or a fuse. The number of the conducting terminals 133 of the electronic component 13 is determined according to the type and the configuration of the electronic component 13. As shown in FIG. 1A, the electronic component 13 may be an integrated circuit (IC) chip. According to the configuration of the IC chip, the electronic component 13 has three conducting terminals 133.

In an embodiment, the first thermal release material 12 is a thermal release tape. The electronic component 13 is disposed between two adjacent thermal conduction structures 14. In some embodiments, the thermal conduction structure 14 is implemented by a metallic lead frame. In some other embodiments, the thermal conduction structure 14 is implemented by a PCB substrate or a ceramic substrate with a good thermally conductive property.

Then, as shown in FIG. 1B, a lamination process is performed. A first insulation layer 15 is formed on the first surface 131 of the electronic component 13 and the first surface 141 of the thermal conduction structure 14 to cover the conducting terminals 133 of the electronic component 13 and the thermal conduction structure 14. In an embodiment, the first insulation layer 15 includes a resin or any other appropriate insulation material with high thermal conductivity, such as Ajinomoto build-up film.

Then, as shown in FIG. 1C, the first carrier 11 and the first thermal release material 12 are removed. Consequently, the second surface 132 of the electronic component 13 and the second surface 142 of the thermal conduction structure 14 are exposed.

Then, as shown in FIG. 1D, a second carrier 17 is provided, and a second thermal release material 16 is formed on the second carrier 17. Then the first insulation layer 15 with the electronic component 13 and the thermal conduction structure 14 is attached on the second thermal release material 16.

Then, as shown in FIG. 1E, a back grinding process is performed. At least one of a portion of the second surface 132 of the electronic component 13, a portion of the second surface 142 of the thermal conduction structure 14, and a portion of the first insulation layer 15 is grinded till a specific thickness H2 of the electronic component 13 is obtained. In an embodiment, a portion of a second surface 132 of the electronic component 13, a portion of a second surface 142 of the thermal conduction structure 14, and a portion of the first insulation layer 15 are grinded. In an embodiment, specific thickness H2 of the electronic component 13 may be less than or equal to 50 μm when a portion of the electronic component 13 is grinded. In an embodiment, the back grinding process may be performed by a mechanical grinding method.

Then, as shown in FIG. 1F, a lamination process is performed. A second insulation layer 18 is formed on the second surface 132 of the electronic component 13 and the second surface 142 of the thermal conduction structure 14. A portion of the second insulation layer 18 is contacted and connected with a portion of the first insulation layer 15. In an embodiment, the first insulation layer 15 and the second insulation layer 18 may be made of same materials, so that the first insulation layer 15 and the second insulation layer 18 are integrally formed into one piece. Consequently, the electronic component 13 and the thermal conduction structure 14 are disposed between the first insulation layer 15 and the second insulation layer 18. In an embodiment, the second insulation layer 18 includes a resin or any other appropriate insulation material with high thermal conductivity, such as Ajinomoto build-up film.

Then, as shown in FIG. 1G, the second carrier 17 and the second thermal release material 16 are removed. Consequently, the first insulation layer 15 is exposed, and the electronic component 13 and the thermal conduction structures 14 are embedded in the combination of the first insulation layer 15 and the second insulation layer 18.

Then, as shown in FIG. 1H, plural first openings 151 are formed on the first insulation layer 15. The plural first openings 151 are formed according to designed pattern of circuit diagram. The plural first openings 151 are corresponding to the conducting terminals 133 of the electronic component 13 and/or the first surface 141 of the thermal conduction structure 14. In an embodiment, the plural first openings 151 are formed by a drilling process. In an embodiment, the drilling process may be a laser drilling process.

Then, as shown in FIG. 1I, plural second openings 152 (i.e. blind vias) are formed on the first insulation layer 15 and formed through the corresponding first openings 151. The plural second openings 152 are disposed between the corresponding first openings 151 and the corresponding conducting terminals 133 of the electronic component 13 and/or disposed between the corresponding first openings 151 and the corresponding thermal conduction structure 14. The conducting terminals 133 of the electronic component 13 and the first surface 141 of the thermal conduction structure 14 are exposed through the corresponding second openings 152. In an embodiment, the size of the second opening 152 is smaller than the size of the corresponding first opening 151. In an embodiment, the plural second openings 152 are formed by a drilling process. Preferably but not exclusively, in the embodiment, the drilling process may be a laser drilling process. In the embodiment, the energy of the laser of drilling the plural second openings 152 is larger than the energy of the laser of drilling the plural first openings 151.

Then, as shown in FIG. 1J, a sputtering process is performed. A first metal layer 191 is formed through the plural second openings 152 and the plural first openings 151. Consequently, the first metal layer 191 is disposed on the conducting terminals 133 of the electronic component 13 and the first surface 141 of the thermal conduction structure 14. Moreover, the first metal layer 191 is disposed on the first insulation layer 15. In an embodiment, the first metal layer 191 is formed by depositing a metal layer, such as a copper (Cu) layer, a TiW/Cu layer, a NiCr/Cu layer or a combination thereof, over the resulting structure of FIG. H.

Then, as shown in FIG. 1K, plural third openings 181 are formed on the second insulation layer 18. The plural third openings 181 are formed according to designed pattern of circuit diagram. The plural third openings 181 are corresponding to the second surface 142 of the thermal conduction structure 14. In some embodiments, the plural third openings 181 are corresponding to the second surface 142 of the thermal conduction structure 14 and the second surface 132 of the electronic component 13. In an embodiment, the plural third openings 181 are formed by a drilling process. In an embodiment, the drilling process may be a laser drilling process.

Then, as shown in FIG. 1L, plural fourth openings 182 (i.e. blind vias) are formed on the second insulation layer 18 and formed through the corresponding third openings 181. The plural fourth openings 182 are disposed between the corresponding third openings 181 and corresponding second surface 142 of the thermal conduction structure 14. The second surface 142 of the thermal conduction structure 14 is exposed through the corresponding fourth opening 182. In an embodiment, the size of the fourth opening 182 is smaller than the size of the corresponding third opening 181. In an embodiment, the plural fourth openings 182 are formed by a drilling process. In an embodiment, the drilling process may be a laser drilling process. In an embodiment, the energy of the laser of drilling the fourth openings 182 may be larger than the energy of the laser of drilling the third openings 181.

Then, as shown in FIG. 1M, a sputtering process is performed. A second metal layer 192 is formed through the plural fourth openings 182 and the plural third openings 181. Consequently, the second metal layer 192 is disposed on the second surface 142 of the thermal conduction structure 14. In an embodiment, the second metal layer 192 is formed by depositing a metal layer, such as a copper (Cu) layer, a TiW/Cu layer, a NiCr/Cu layer or a combination thereof, under the resulting structure of FIG. 1L.

Then, as shown in FIG. 1N, a grinding process is performed. A portion of the first metal layer 191 is grinded to form at least one first contact pad 193 and at least one second contact pad 194. The first contact pad 193 is corresponding to and in contact with the conducting terminal 133. The second contact pad 194 is corresponding to and in contact with the first surface 141 of the thermal conduction structure 14. In an embodiment, plural first contact pads 193 are formed, at least one of the first contact pads 193 is corresponding to and in contact with a corresponding conducting terminal 133 of the electronic component 13.

Then, as shown in FIG. 1O, a grinding process is performed. A portion of the second metal layer 192 is grinded to form at least one third contact pad 195. The third contact pad 195 is corresponding to and in contact with the second surface 142 of the thermal conduction structure 14.

Then, as shown in FIG. 1P, a first passivation layer 21 is formed and attached on at least a portion of the first contact pad 193 and a portion of the second contact pad 194. The first passivation layer 21 is configured to avoid the oxidation of the first contact pad 193 and the second contact pad 194. Portion of the second contact pad 194 uncovered by the first passivation layer 21 is exposed. A second passivation layer 22 is formed and attached on a portion of the third contact pad 195. The second passivation layer 22 is configured to avoid the oxidation of the third contact pad 195. Portion of the third contact pad 195 uncovered by the second passivation layer 22 is exposed. In an embodiment, at least one of the first passivation layer 21 and the second first passivation layer 22 includes a resin or any other appropriate insulation material with high thermal conductivity. In an embodiment, the first passivation layer 21 and the second first passivation layer 22 are made of resin or any other appropriate insulation material. Meanwhile, a power module 1 with the embedded package structure is fabricated.

Then, as shown in FIG. 1Q, a passive component 23 is provided and mounted on the first passivation layer 21. Consequently, a portion of the passive component 23 is coupled with the second contact pad 194, and a portion of the passive component 23 is coupled with one first contact pad 193, which is corresponding to and in contact with a corresponding conducting terminal 133 of the electronic component 13 and a corresponding first surface 141 of the thermal conduction structure 14. Then, a board (not shown) is provided on the second passivation layer 22. The board is coupled with the third contact pad 195. Consequently, the power module 1 with the embedded package structure is disposed on the board.

Figure 2A:
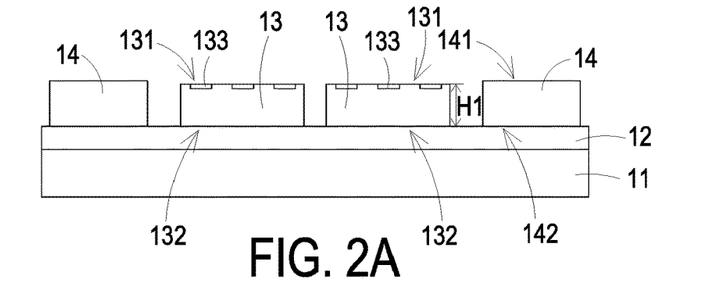
FIGS. 2A to 2Q are schematic cross-sectional views illustrating a packaging process of an electronic component according to a second embodiment of the present invention.
Figure 2B:
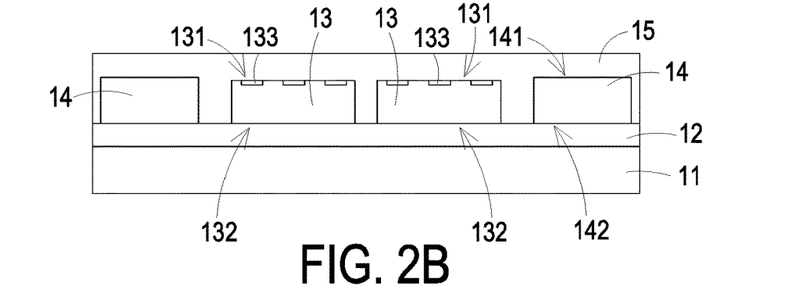
Figure 2C:
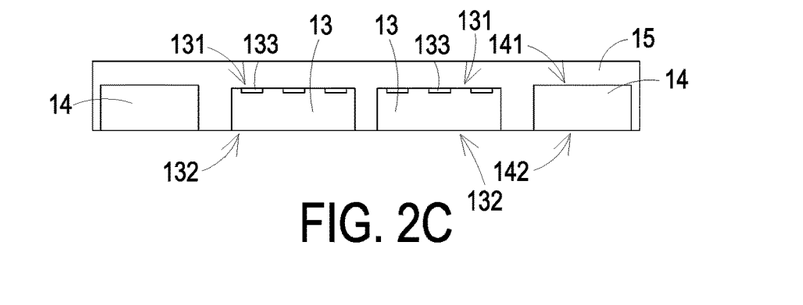
Figure 2D:
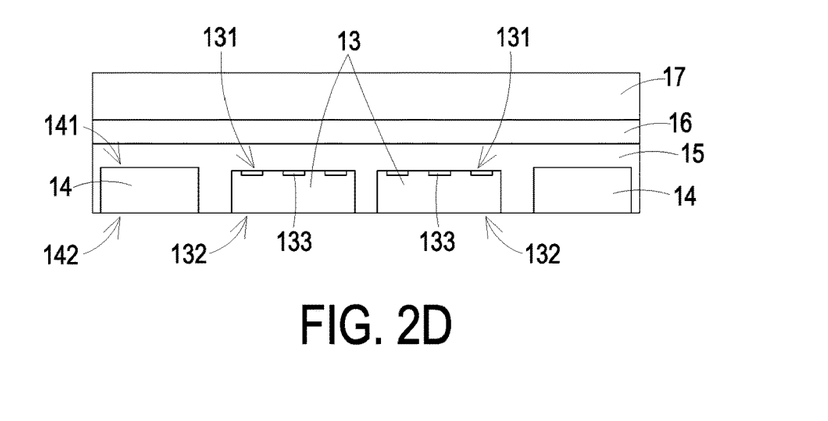
Figure 2E:
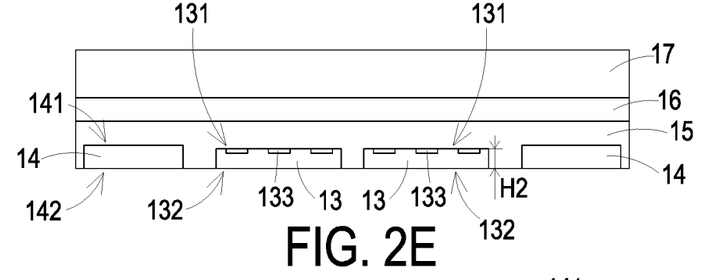
Figure 2F:
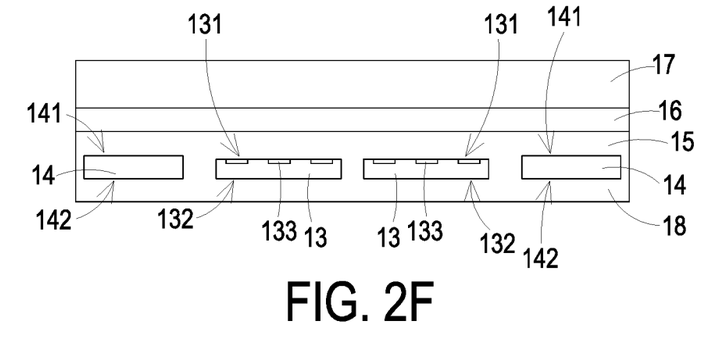
Figure 2G:
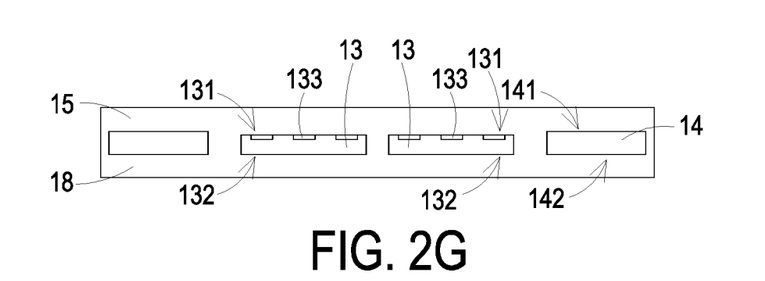
Figure 2H:
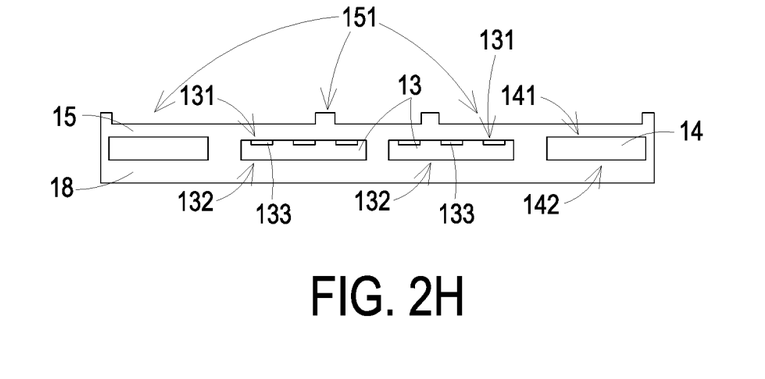
Figure 2I:
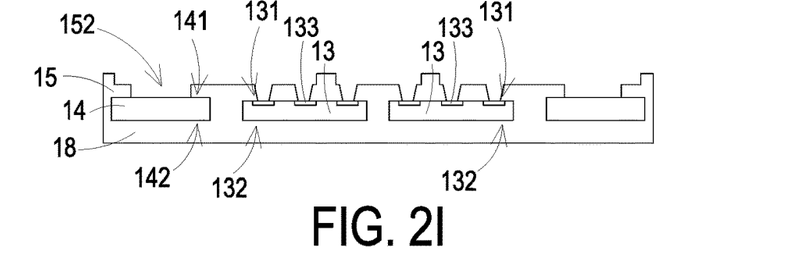
Figure 2J:
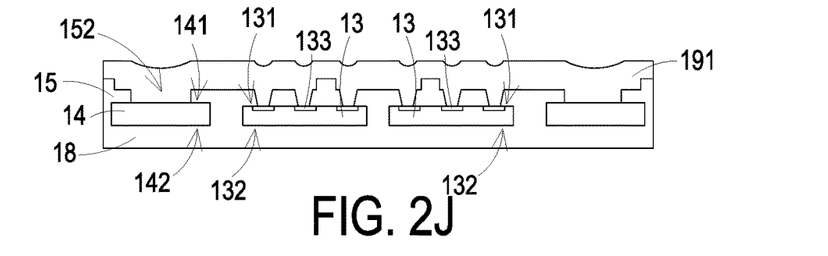
Figure 2K:
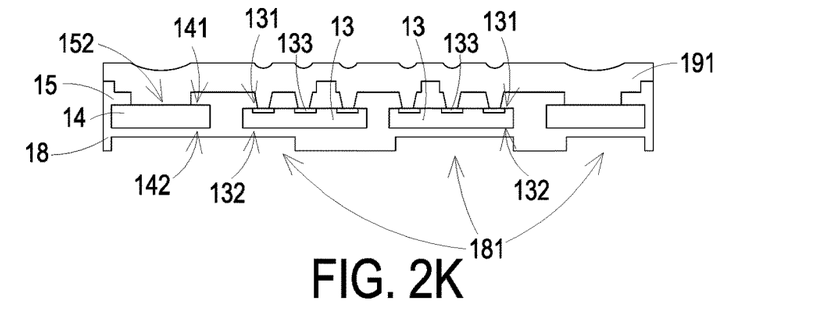
Figure 2L:
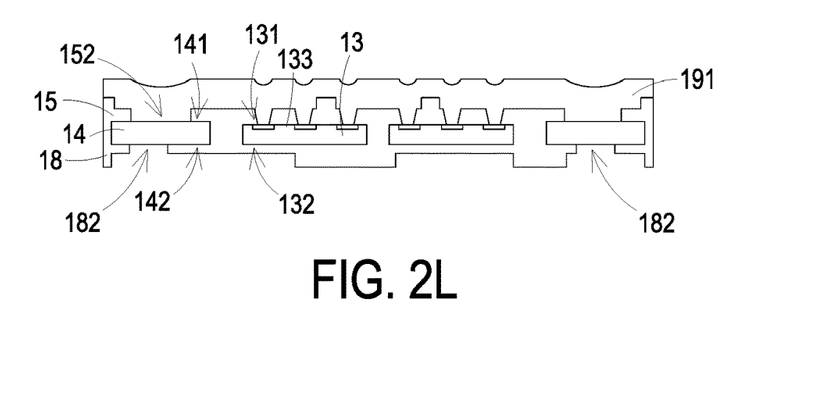
Figure 2M:
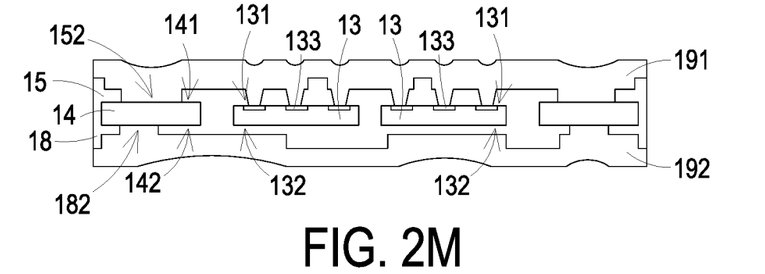
Figure 2N:
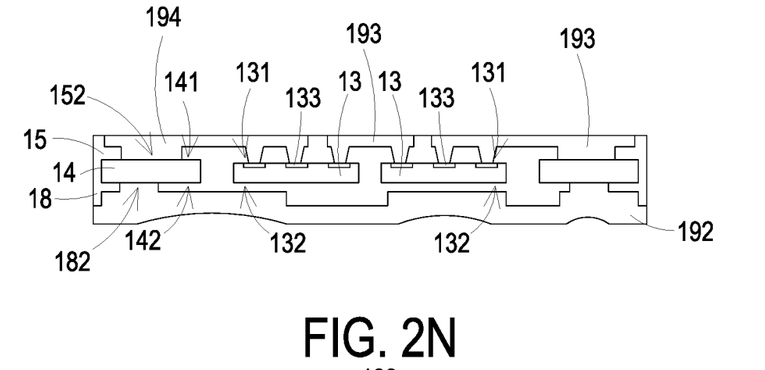
Figure 2O:
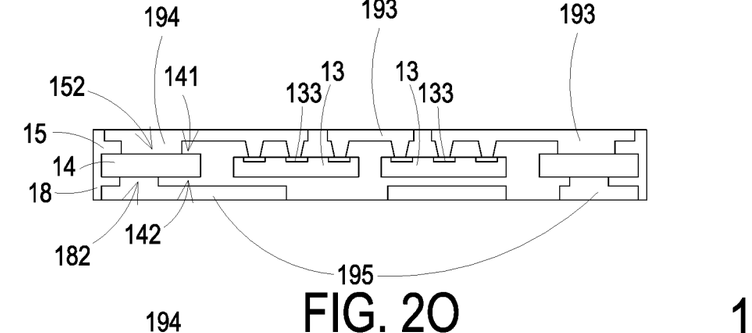
Figure 2P:
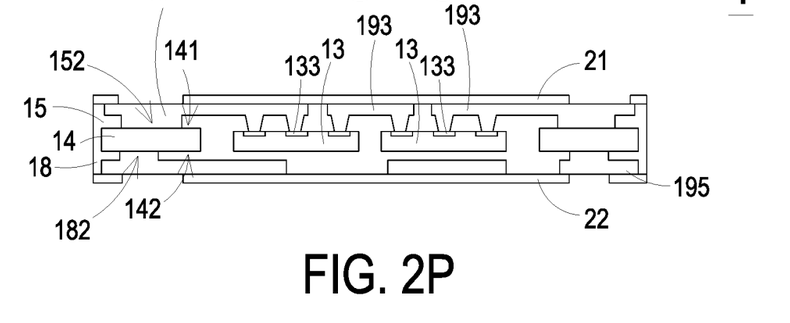
Figure 2Q:
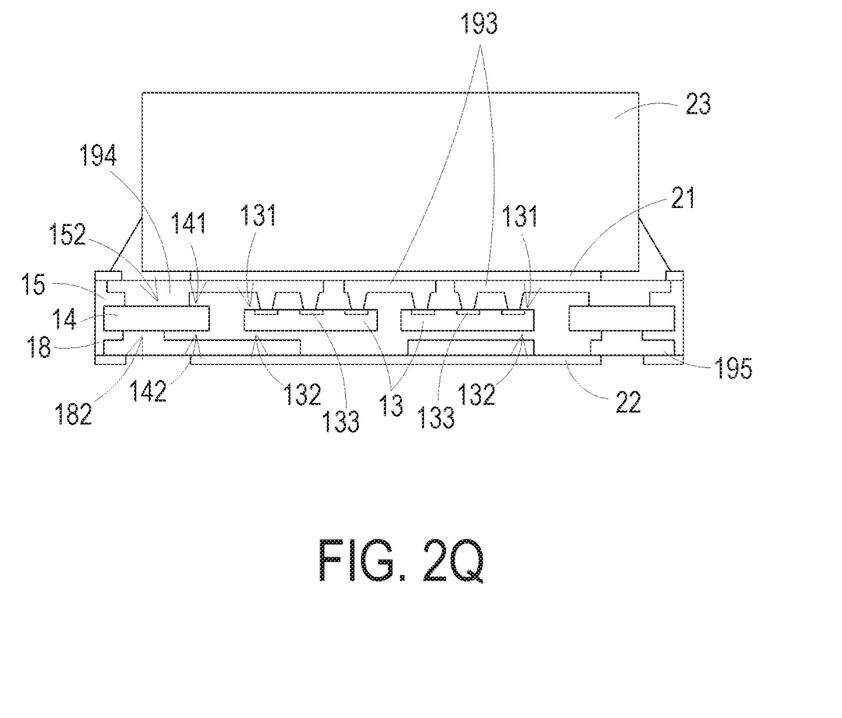

FIGS. 2A to 2Q are schematic cross-sectional views illustrating a packaging process of an electronic component according to a second embodiment of the present invention. Component parts and elements corresponding to those of the first embodiment are designated by identical numeral references, and detailed descriptions thereof are omitted. As shown in FIGS. 2A to 2Q, plural electronic components 13 are provided. The plural electronic components 13 are disposed between the plural thermal conduction structures 14. Namely, at least two electronic components 13 are disposed between two adjacent thermal conduction structures 14. In the embodiment, the steps as shown in FIGS. 2A to 2Q are similar to the steps as shown in FIGS. 1A to 1Q, and are not redundantly described herein.

From the above description, the embodiments of the present invention provide packaging processes of electronic component. By the packaging process of the embodiment of the present invention, the electronic component is grinded by the back grinding process. Consequently, thickness of the electronic component can be reduced to less than or equal to 50 μm. The embodiments of the packaging process can achieve ultra-thin thickness and reduce the space of the power module. Moreover, the embodiments of the packaging process may form the contact pads with drilling process and grinding process and omit the photolithography process. Consequently, the embodiments of the packaging process may be advantageous because of lower cost and uniform thickness of the contact pads.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. A packaging process comprising steps of:
   providing a first carrier;
   forming a first thermal release material on the first carrier;
   providing at least one electronic component and at least one thermal conduction structure attached on the first thermal release material, wherein the at least one electronic component comprises at least one conducting terminal;
   forming a first insulation layer on a first surface of the electronic component and a first surface of the thermal conduction structure;
   removing the first carrier and the first thermal release material;
   providing a second carrier;
   forming a second thermal release material on the second carrier;
   attaching the first insulation layer with the electronic component and the thermal conduction structure on the second thermal release material;
   grinding at least one of a portion of a second surface of the electronic component, a portion of a second surface of the thermal conduction structure, and a portion of the first insulation layer;
   forming a second insulation layer on the second surface of the electronic component and the second surface of the thermal conduction structure;
   removing the second carrier and the second thermal release material;
   forming plural first openings on the first insulation layer;
   forming plural second openings through the corresponding first openings, wherein the conducting terminal and the first surface of the thermal conduction structure are exposed through the plural second openings;
   forming a first metal layer through the plural second openings and disposed on the conducting terminal and the first surface of the thermal conduction structure;
   forming plural third openings on the second insulation layer;
   forming plural fourth openings through the plural third openings, wherein the second surface of the thermal conduction structure is exposed through the fourth opening;
   forming a second metal layer through the plural fourth openings and disposed on the second surface of the thermal conduction structure;
   grinding a portion of the first metal layer to form at least one first contact pad and at least one second contact pad; and
   grinding a portion of the second metal layer to form at least one third contact pad.

2. The packaging process according to claim 1, wherein the at least one first contact pad is corresponding to and in contact with the conducting terminal of the electronic component, the at least one second contact pad is corresponding to and in contact with the first surface of the thermal conduction structure, and the at least one third contact pad is corresponding to and in contact with the second surface of the thermal conduction structure.

3. The packaging process according to claim 1, wherein the packaging process further comprises steps:
   forming a first passivation layer on at least portion of the at least one first contact pad and a portion of the at least one second contact pad; and
   forming a second passivation layer on a portion of the at least one third contact pad, wherein a portion of the at least one second contact pad uncovered by the first passivation layer is exposed, and a portion of the at least one third contact pad uncovered by the second passivation layer is exposed.

4. The packaging process according to claim 3, wherein the packaging process further comprises a step:
  providing a passive component on the first passivation layer, wherein a portion of the passive component is coupled with the at least one second contact pad.

5. The packaging process according to claim 3, wherein the packaging process further comprises a step:
  providing a board on the second passivation layer, wherein the board is coupled with the at least one third contact pad.

6. The packaging process according to claim 3, wherein at least one of the first passivation layer and the second passivation layer comprises at least one of a resin, an insulation material, and a combination thereof.

7. The packaging process according to claim 1, wherein at least one of the first insulation layer and the second insulation layer comprises at least one of a resin, an Ajinomoto build-up film, and a combination thereof.

8. The packaging process according to claim 1, wherein the at least one conducting terminal of the at least one electronic component is disposed on the first surface of the at least one electronic component.

9. The packaging process according to claim 1, wherein plural thermal conduction structures are provided, wherein the at least one electronic component is disposed between or encompassed by the plural thermal conduction structures.

10. The packaging process according to claim 9, wherein plural electronic components are provided, wherein the plural electronic components are disposed between the plural thermal conduction structures.

11. The packaging process according to claim 1, wherein the electronic component is grinded till a specific thickness of the electronic component is obtained, wherein the specific thickness of the electronic component is less than or equal to 50 μm.

12. The packaging process according to claim 1, wherein at least one of the first metal layer and the second metal layer comprises copper or copper-containing material.

13. The packaging process according to claim 1, wherein at least one of the plural first openings, the plural second openings, the plural third openings, and the plural fourth openings is formed by a drilling process.

* * * * *